(12) United States Patent
Yang

(10) Patent No.: US 9,343,477 B2
(45) Date of Patent: May 17, 2016

(54) SEMICONDUCTOR DEVICE AND METHOD FOR FABRICATING THE SAME

(71) Applicant: MACRONIX International Co., Ltd., Hsinchu (TW)

(72) Inventor: Chin-Cheng Yang, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 0 days.

(21) Appl. No.: 14/478,626

(22) Filed: Sep. 5, 2014

(65) Prior Publication Data
US 2016/0071867 A1 Mar. 10, 2016

(51) Int. Cl.
*H01L 27/115* (2006.01)
*H01L 21/311* (2006.01)
*H01L 21/3213* (2006.01)
*H01L 21/28* (2006.01)

(52) U.S. Cl.
CPC .... *H01L 27/11582* (2013.01); *H01L 21/28282* (2013.01); *H01L 21/31111* (2013.01); *H01L 21/31144* (2013.01); *H01L 21/32133* (2013.01); *H01L 21/32139* (2013.01)

(58) Field of Classification Search
CPC ............... H01L 27/11582; H01L 27/11578; H01L 27/11575; H01L 27/11548; H01L 27/11551
See application file for complete search history.

(56) References Cited

U.S. PATENT DOCUMENTS

2011/0049611 A1* 3/2011 Kiyotoshi et al. ............ 257/326
2014/0061849 A1* 3/2014 Tanzawa ....................... 257/499

FOREIGN PATENT DOCUMENTS

| CN | 102347218 | 1/2014 |
| TW | 201210001 | 3/2012 |
| TW | 201342660 | 10/2013 |

OTHER PUBLICATIONS

"Office Action of Taiwan Counterpart Application", issued on Jun. 1, 2015, p. 1-p. 7.

* cited by examiner

*Primary Examiner* — Tucker J Wright
(74) *Attorney, Agent, or Firm* — J.C. Patents

(57) ABSTRACT

Provided is a semiconductor device including a substrate and a stack layer. The substrate includes a first region, a second region, and a third region. The third region is disposed between the first region and the second region. Since a top surface of the substrate in the first region is lower than the top surface of the substrate in the second region, the substrate in the third region has a first step height. The stack layer is disposed on the substrate in the first and third regions. The top surface of the stack layer in the first region and the third region and the top surface of the substrate in the second region are substantially coplanar.

11 Claims, 8 Drawing Sheets

SEMICONDUCTOR DEVICE AND METHOD FOR FABRICATING THE SAME

BACKGROUND OF THE INVENTION

1. Field of the Invention

The invention relates to an electronic device and a method for fabricating the same, and particularly relates to a semiconductor device and a method for fabricating the same.

2. Description of Related Art

As science and technology advance, it has become a trend to integrate devices in the memory cell array region and the peripheral circuit region in the same chip to reduce the cost, simplify the process, and reduce the chip area. However, there is a significant step height in the boundary region between the memory cell array region and the peripheral circuit region, making subsequent processes more complex.

FIG. 1 is a cross-sectional schematic view illustrating a conventional semiconductor device. Referring to FIG. 1, for example, to reduce a height of a stack layer 12 on a surface of a substrate 10 in a conventional semiconductor device, a part of the substrate 10 in a memory cell array region 110 is removed for embedding the stack layer 12 therein. However, such method results in a significant step height in a boundary region 130 between the memory cell array region 110 and a peripheral circuit region 120. To solve the issue of step height, a relatively long distance (approximately 3 μm) needs to be kept as the boundary region 130 between the memory cell array region 110 and the peripheral circuit region 120. Then, after a series of complicated processes, such as photolithography, etching, film deposition, and planarization (e.g. chemical mechanical polishing, CMP) processes, etc., a huge and deep trench 18 is formed in the boundary region 130. Meanwhile, during the processes, a silicon nitride layer 14 and a silicon oxide layer 16 are filled in the trench 18. However, since the silicon nitride layer 14 and the silicon oxide layer 16 have different etching rates, after removing redundant parts of the silicon nitride layer 14 and the silicon oxide layer 16 by using a wet etching process, recesses 20 are commonly produced at two sides of the silicon nitride layer 14, and a top surface of the silicon oxide layer 16 is slightly higher than top surfaces of the memory cell array region 110 and the peripheral circuit region 120. As the planarization process at the boundary requires complicated steps in the manufacturing process, the cost thereof is high. Besides, the remaining height difference according to the conventional method also increases the complexity of subsequent processes, making product reliability reduced.

Thus, how to simplify the process for treating the boundary region between the memory cell array region and the peripheral circuit region and minimize the difference in step height between regions, thereby reducing the complexity of the subsequent processes, increasing the chip area, and reducing the cost at the same time has become an important issue.

SUMMARY OF THE INVENTION

The invention provides a semiconductor device and a method for fabricating the same capable of reducing a step height in the boundary region between the memory cell array region and the peripheral circuit region.

The invention provides a semiconductor device and a method for fabricating the same capable of simplifying a process of fabrication and increasing a chip area at the same time.

The invention provides a method for fabricating a semiconductor device, including providing a substrate. The substrate includes a first region, a second region, and a third region. A top surface of the substrate in the first region is lower than the top surface of the substrate in the second region, and the substrate in the third region has a first step height. The third region is disposed between the first region and the second region. A stack layer is conformally formed on the substrate. The stack layer in the third region has a second step height. A flowable material layer is formed on the stack layer. A first etching process is performed to the flowable material layer to remove a part of the flowable material layer. By using the flowable material layer in the first region as a mask, a second etching process is performed to the stack layer in the second region and the third region to expose a top surface of the substrate in the second region. The flowable material layer is removed.

According to an embodiment of the invention, in the step of conformally forming the stack layer on the substrate, a top surface of the stack layer in the first region and the top surface of the substrate in the second region are substantially coplanar.

According to an embodiment of the invention, after the step of removing the flowable material layer, a top surface of the stack layer in the third region is substantially equal to or lower than the top surface of the substrate in the second region.

According to an embodiment of the invention, a material of the flowable material layer includes an organic material, an inorganic material, or an organic-inorganic composite material.

According to an embodiment of the invention, a material of the flowable material layer includes an organic material. The organic material of the flowable material layer includes a photoresist (PR), an organic under layer (ODL), a bottom anti-reflection coating (BARC), or a spin-on glass (SOG).

According to an embodiment of the invention, the flowable material layer includes a single-layer structure, a dual-layer structure, or a multi-layer structure.

According to an embodiment of the invention, the flowable material layer includes a dual-layer structure. The dual layer structure includes a first material layer and a second material layer. The first material layer and the second material layer are of the same material.

According to an embodiment of the invention, the flowable material layer includes a dual-layer structure. The dual layer structure includes a first material layer and a second material layer. The first material layer and the second material layer are of different materials.

According to an embodiment of the invention, the stack layer includes a plurality of dielectric layers and a plurality of conductive layers. The dielectric layers and the conductive layers are stacked alternately. An etching rate of the second etching process to the dielectric layers is equal to an etching rate to the conductive layers.

According to an embodiment of the invention, after performing the first etching process to the flowable material layer, the stack layer in the second region is exposed.

According to an embodiment of the invention, after performing the first etching process to the flowable material layer, a thickness of the flowable material layer remaining in the first region is greater than a thickness of the flowable material layer remaining in the second region and greater than the second step height.

According to an embodiment of the invention, after performing the first etching process to the flowable material layer, a thickness of the flowable material layer remaining in the first region is greater than a thickness of the flowable material layer remaining in the second region and less than the second step height.

According to an embodiment of the invention, the step of forming the substrate includes performing a first patterning process to the substrate, and removing the substrate in the first region and the third region, such that the top surface of the substrate in the first region is lower than the top surface of the substrate in the second region.

According to an embodiment of the invention, after removing the flowable material layer in the first region, a second patterning process is performed to the stack layer in the first region to remove a part of the stack layer in the first region, thereby forming a plurality of trenches in a stack layer in the first region. A charge storage layer and a corresponding conductive pillar are sequentially formed in each of the trenches. The charge storage layer is disposed between the conductive pillars and the stack layer.

The invention provides a semiconductor device including a substrate and a stack layer. The substrate includes a first region, a second region, and a third region. The third region is disposed between the first region and the second region. Since a top surface of the substrate in the first region is lower than the top surface of the substrate in the second region, the substrate in the third region has a first step height. The stack layer is disposed on the substrate in the first and third regions. The top surface of the stack layer in the first region and the third region and the top surface of the substrate in the second region are substantially coplanar.

According to an embodiment of the invention, a top surface of the stack layer in the third region is substantially equal to or lower than the top surface of the substrate in the second region.

According to an embodiment of the invention, the stack layer includes a plurality of dielectric layers and a plurality of conductive layers. The dielectric layers and the conductive layers are stacked alternately.

According to an embodiment of the invention, the semiconductor device further includes a plurality of conductive pillars and a plurality of charge storage layers. The conductive pillars are disposed in the stack layer in the first region. The charge storage layers are disposed between the conductive pillars and the stack layer.

According to an embodiment of the invention, the first region is a memory cell array region, and the second region is a peripheral circuit region.

According to an embodiment of the invention, a width of the third region is from 40 nm to 140 nm.

Based on the above, in the embodiments of the invention, the flowable material layer is used to cover the stack layer in the first region and partially cover the stack layer in the third region, such that the top surface of the flowable material layer in the first region and the third region is approximately equal to the top surface of the stack layer in the second region. Then, by using the flowable material layer in the first region as a mask, an etching process is performed to the stack layer in the second region and the third region to expose a top surface of the substrate in the second region. The top surface of the stack layer in the first region and the third region is approximately equal to the top surface of the substrate in the second region. Accordingly, the step height in the boundary region (e.g. the third region) between the memory cell array region (e.g. the first region) and the peripheral circuit region (e.g. the second region) is reduced, thereby simplifying the complexity of the subsequent processes and thus reducing the cost of fabrication.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
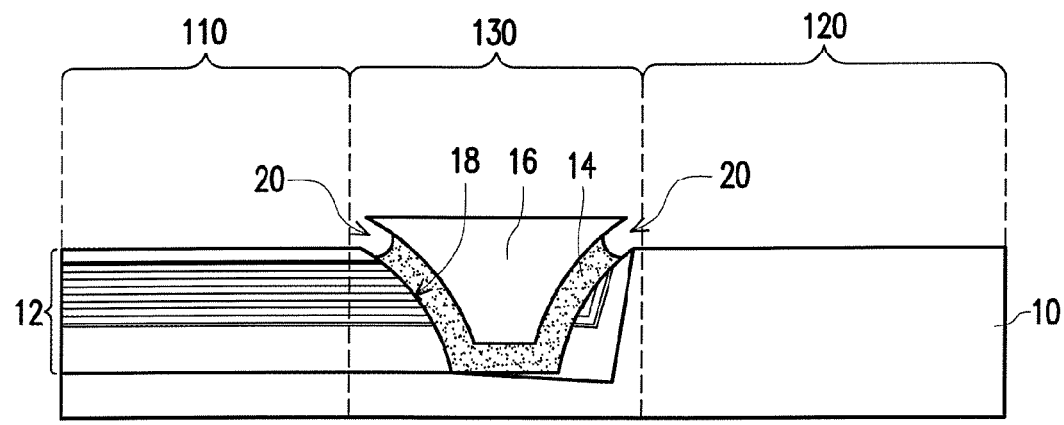
FIG. 1 is a cross-sectional schematic view illustrating a conventional semiconductor device.

Reference will now be made in detail to the present preferred embodiments of the invention, examples of which are illustrated in the accompanying drawings. Wherever possible, the same reference numbers are used in the drawings and the description to refer to the same or like parts.

FIGS. 2A to 2G are cross-sectional schematic views illustrating a method for fabricating a semiconductor device according to an embodiment of the invention.

Figure 2A:
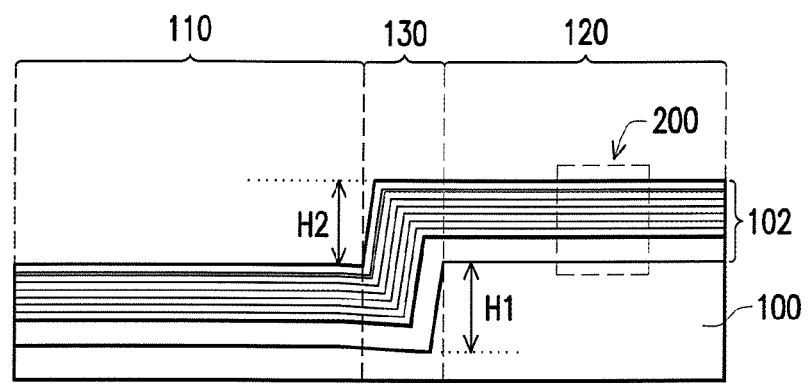
FIGS. 2A to 2G are cross-sectional schematic views illustrating a method for fabricating a semiconductor device according to an embodiment of the invention.

Referring to FIG. 2A, at first, a substrate 100 is provided. The substrate 100 includes a first region 110, a second region 120, and a third region 130. The third region 130 is located between the first region 110 and the second region 120. A top surface of the substrate 100 in the first region 110 is lower than a top surface of the substrate 100 in the second region 120, and the substrate 100 in the third region 130 has a first step height H1. In an embodiment of the invention, the first step height H1 is from 40 nm to 140 nm. In an embodiment, the first region 110 is a memory cell array region, the second region 120 is a peripheral circuit region, and the third region 130 is a boundary region between the memory cell array region and the peripheral circuit region. In an embodiment, a width of the third region 130 is from 40 nm to 140 nm, and the width of the third region 130 is significantly shorter than a distance of 3 µm kept in the conventional technology.

In an embodiment, a first patterning process may be performed to a substrate material of the substrate 100 by using photolithography and etching processes to remove a part of the substrate material corresponding to the first region 110 and the third region 130. In another embodiment, a silicon-containing material layer (not shown) may be formed on the substrate material of the substrate 100 corresponding to the second region 120, such that a top surface of the silicon-containing material layer in the second region 120 is higher than a top surface of the substrate material in the first region 110. The substrate material may be a semiconductor substrate, a semiconductor compound substrate, or a semiconductor over insulator (SOI) substrate, for example. The semiconductor is atoms of IVA Group, for example, such as silicon or germanium. The semiconductor compound is a semiconductor compound formed of atoms of IVA Group, such as silicon carbide or germanium silicide, for example, or a semiconductor compound formed of atoms of IIIA Group and VA Group, such as gallium arsenide, for example.

Figure 3:
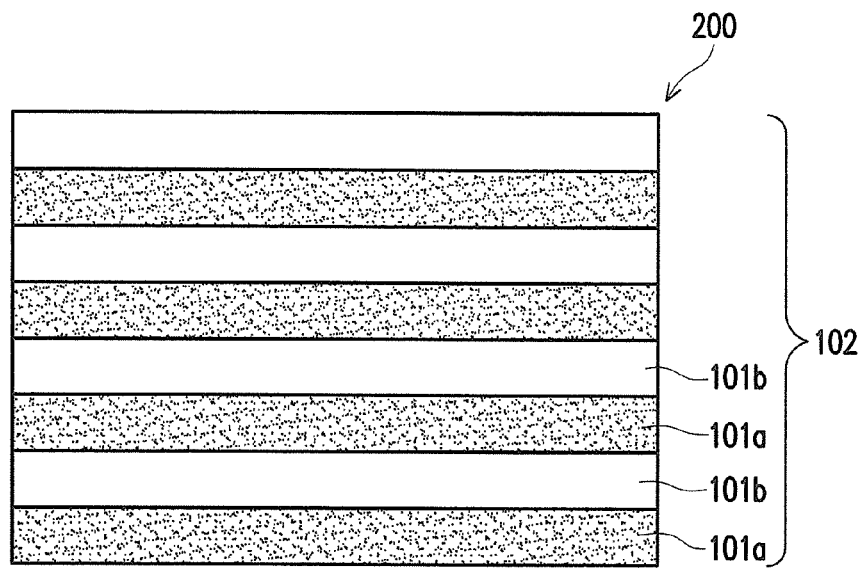
FIG. 3 is an enlarged schematic view illustrating a partial stack layer shown in FIG. 2A.

Then, a stack layer 102 is conformally formed on the substrate 100, making the top surface of the stack layer 102 in the first region 110 and the top surface of the substrate 100 in the second region 120 substantially coplanar. In other words, a thickness of the stack layer 102 is approximately equal to the first step height H1. Since the stack layer 102 conformally covers the substrate 100, the top surface of the stack layer 102 in the first region 110 is lower than the top surface of the stack layer 102 in the second region 120, and the stack layer 102 in the third region 130 has a second step height H2. In an embodiment, the stack layer 102 may be a single layer or multi-layer composite layer, for example. When the stack layer 102 is a multi-layer composite layer, for example, an enlarged view of a partial stack layer 200 is as shown in FIG. 3. The stack layer 102 includes a plurality of dielectric layers 101a and a plurality of conductive layers 101b. The dielectric layers 101a and the conductive layers 101b are stacked alternately. In an embodiment, the number of layers of the conductive layers 101b may be 8, 16, 32, or more. Similarly, since each of the dielectric layers 101a is disposed between two adjacent conductive layers 101b, the number of layers of the dielectric layers 101a may also be 8, 16, 32, or more. In an embodiment, a material of the dielectric layers 101a may include silicon oxide, silicon nitride, or a combination thereof, and a method of forming the dielectric layers 101a may be the chemical vapor deposition method. A material of the conductive layers 101b may be doped polysilicon, undoped polysilicon, or a combination thereof, and a method of forming the conductive layers 101b may be the chemical vapor deposition method. In an embodiment of the invention, the second step height H2 may be 40 nm to 140 nm.

Figure 2B:
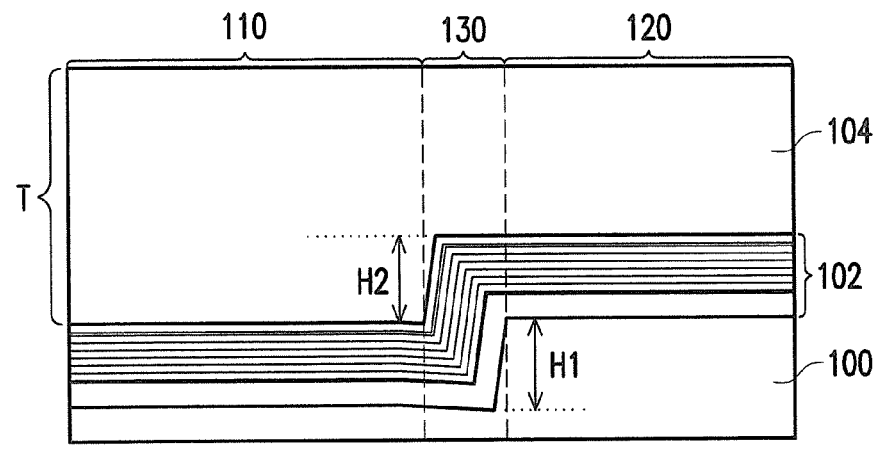

Referring to FIG. 2B, a flowable material layer 104 is formed on the stack layer 102 in the first region 110, the second region 120, and the third region 130. In an embodiment of the invention, a material of the flowable material layer 104 includes an organic material, an inorganic material, or an organic-inorganic composite material. When the material of the flowable material layer 104 is an organic material, the organic material includes a photoresist (PR), an organic under layer (ODL), a bottom anti-reflection coating (BARC), a spin-on glass (SOG), or a combination thereof. A method of forming the flowable material layer 104 may be the spin coating method, the high density plasma chemical vapor deposition (HDPCVD) method, or the enhanced high aspect ratio process (eHARP), for example. The flowable material layer 104 may be a single-layer structure, a dual-layer structure, or a multi-layer structure.

Figure 4:
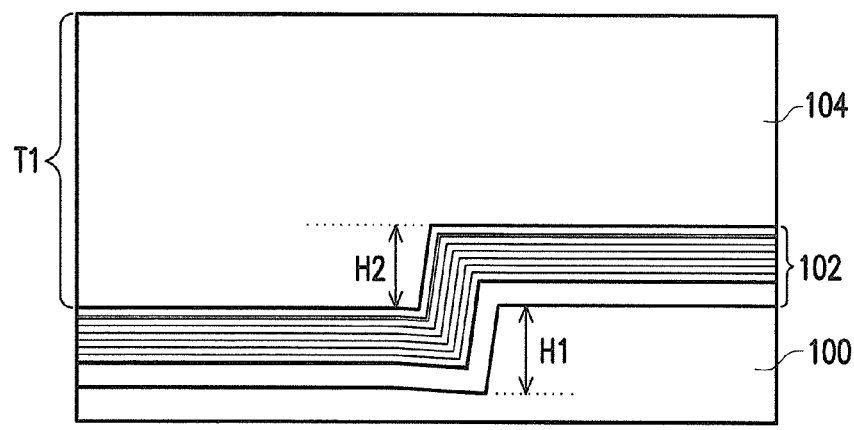
FIG. 4 is a cross-sectional schematic view illustrating a semiconductor device according to a first embodiment of the invention.

As shown in FIG. 4, in a first embodiment of the invention, the flowable material layer 104 is a single-layer structure, for example. The material of the flowable material layer 104 may include a photoresist (PR), an organic under layer (ODL), a bottom anti-reflection coating (BARC), or a spin-on glass (SOG). However, the material of the flowable material layer 104 of the embodiments of the invention is not limited thereto, as long as the flowable material layer 104 covers the top surface of the stack layer 102, and a thickness T1 of the flowable material layer 104 is greater than the second step height H2.

Figure 5:
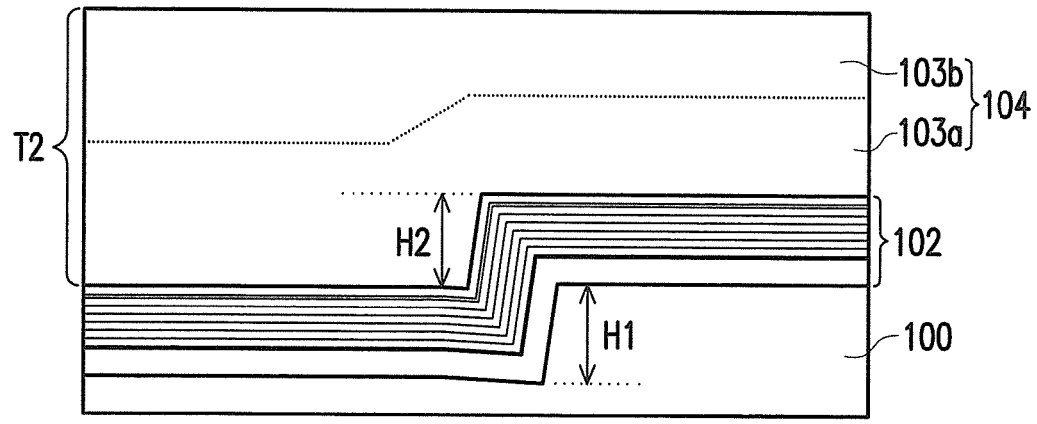
FIG. 5 is a cross-sectional schematic view illustrating a semiconductor device according to a second embodiment of the invention.
Figure 6:
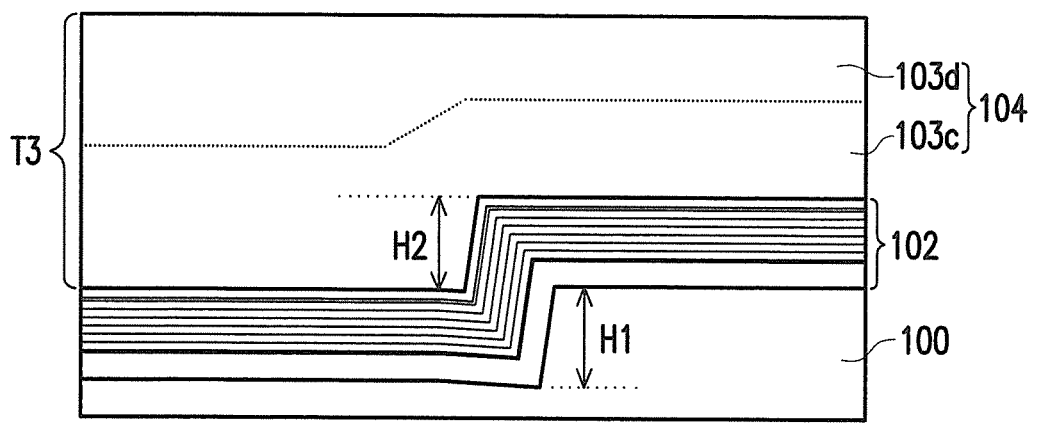
FIG. 6 is a cross-sectional schematic view illustrating a semiconductor device according to a third embodiment of the invention.
Figure 7:
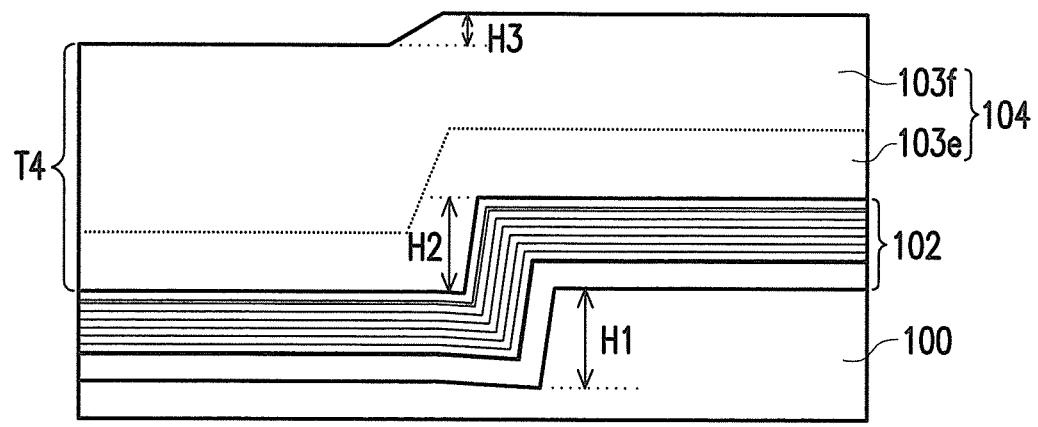
FIG. 7 is a cross-sectional schematic view illustrating a semiconductor device according to a fourth embodiment of the invention.

Referring to FIGS. 5-7, the flowable material layer 104 may be a dual-layer structure, for example. Referring to FIG. 5, in a second embodiment of the invention, a top surface of the flowable material layer 104 is a flat surface, and the flowable material layer 104 sequentially includes a material layer 103a and a material layer 103b. The material layers 103a and 103b may be formed of the same material, for example. The material layer 103b has a flat surface. For example, the material layers 103a and 103b are both organic under layers (ODLs), for example. However, the materials of the material layers 103a and 103b of the embodiments of the invention are not limited thereto, as long as the total thickness T2 of the material layers 103a and 103b is greater than the second step height H2.

Referring to FIG. 6, in a third embodiment of the invention, the top surface of the flowable material layer 104 is a flat surface, and the flowable material layer 104 sequentially includes a material layer 103c and a material layer 103d. The material layers 103c and 103d are formed of different materials, for example. For example, the material layer 103c may be an organic under layer (ODL), for example, while the material layer 103d may be a photoresist (PR), for example. The material layer 103d has a flat surface. However, the materials of the material layers 103c and 103d of the embodiments of the invention are not limited thereto, as long as a total thickness T3 of the material layers 103c and 103d is greater than the second step height H2.

Moreover, referring to FIG. 7, in a fourth embodiment of the invention, the flowable material layer 104 may be a dual-layer or multi-layer structure, for example. In addition, the top surface of the flowable material layer 104 is not flat, while a step height H3 of the top surface of the flowable material layer 104 is less than the step height H2. For example, a single-layer or multi-layer material layer 103e may be formed on the stack layer 102 in a partially conformal manner. Then, a material layer 103f is formed on the single-layer or multi-layer material layer 103e. A surface of the material layer 103f is not flat, and has the step height H3. The material layer 103e may be formed of silicon nitride (SiN), silicon oxide, silicon oxynitride, a carbon layer, or silicon carbide, for example, and a method of Ruining the material layer 103e may be the chemical vapor deposition method. The material layer 103f may be an organic under layer (ODL), for example, and a method of forming the material layer 103f may be the spin coating method. However, the materials of the material layers 103e and 103f of the embodiments of the invention are not limited thereto, as long as the material layers 103e and 103f cover the top surface of the stack layer 102, and a total thickness T4 of the material layers 103e and 103f is greater than the second step height H2.

Figure 2C:
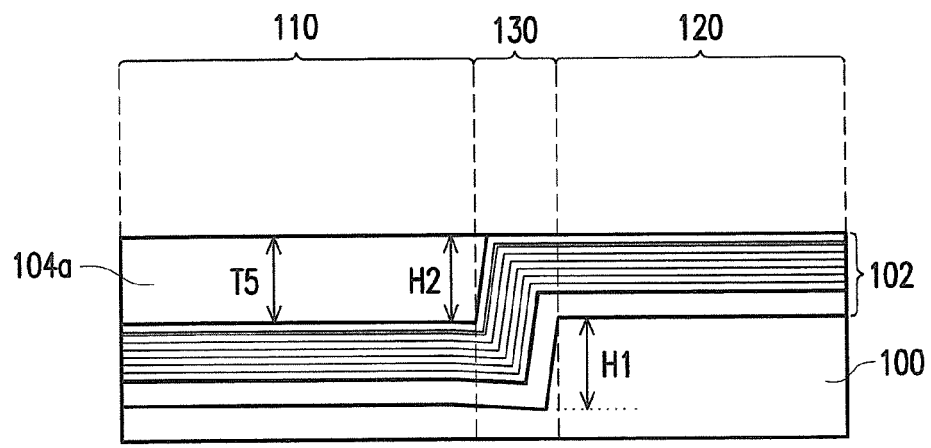
Figure 8:
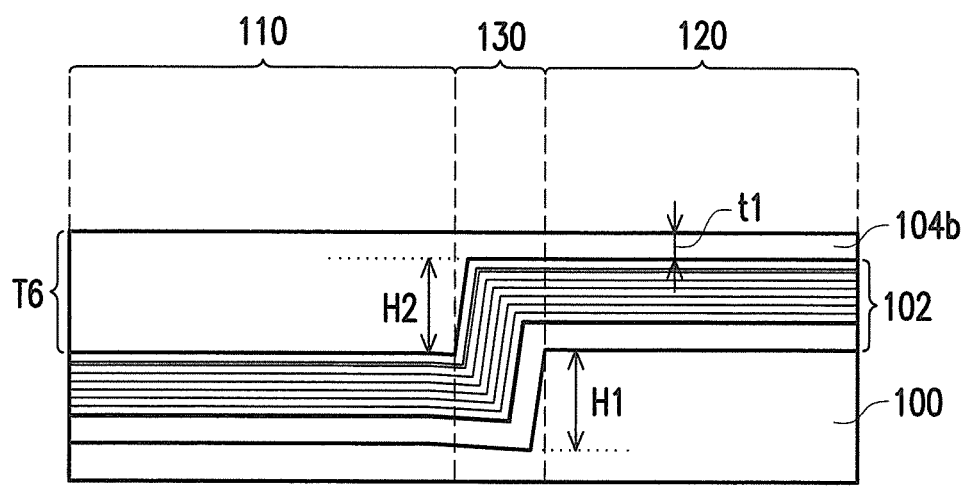
FIG. 8 is a cross-sectional schematic view illustrating a semiconductor device in which a first etching process is performed to a flowable material layer according to another embodiment of the invention.
Figure 9:
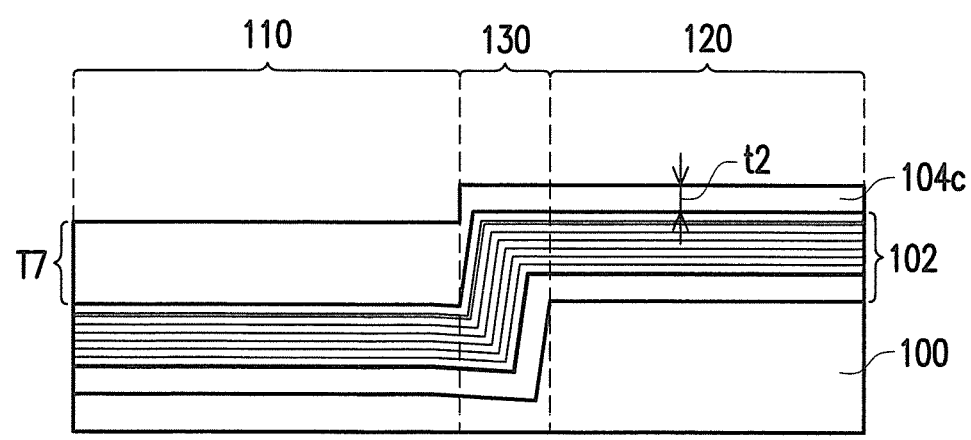
FIG. 9 is a cross-sectional schematic view illustrating a semiconductor device in which a first etching process is performed to a flowable material layer according to yet another embodiment of the invention.

Referring to FIG. 2C and FIGS. 8 and 9, by using the top surface of the stack layer 102 as an etching stop layer, a first etching process is performed to remove a part of the flowable material layer 104 while keep flowable material layers 104a, 104b, or 104c. The first etching process may be an etching back process, for example. In an embodiment, referring to FIG. 2C, after the first etching process is performed, the remaining flowable material layer 104a covers the stack layer 102 in the first region 110 and a part of the stack layer 102 in the third region 130, while exposes the top surface of the stack layer 102 in the second region 120 and the third region 130. In addition, a thickness T5 of the flowable material layer 104a in the first region 110 is substantially equal to the second step height H2. In other words, a top surface of the flowable material layer 104a is substantially equal to the top surface of the stack layer 102 in the second region 120 and the third region 130.

In another embodiment of the invention, as shown in FIG. 8, after performing the first etching process, the remaining flowable material layer 104b covers the stack layer 102 in the first region 110, the second region 120, and the third region 130. The thickness T6 of the flowable material layer 104b in the first region 110 is greater than a thickness t1 of the flowable material layer 104b in the second region 120. Meanwhile, the thickness T6 is substantially greater than the second step height H2.

In yet another embodiment of the invention, as shown in FIG. 9, after performing the first etching process, the remaining flowable material layer 104c covers the stack layer 102 in the first region 110, the second region 120, and the third region 130. A thickness T7 of the flowable material layer 104c in the first region 110 is greater than a thickness t2 of the flowable material layer 104c in the second region 120, and the thickness T7 is less than the second step height H2.

Figure 2D:
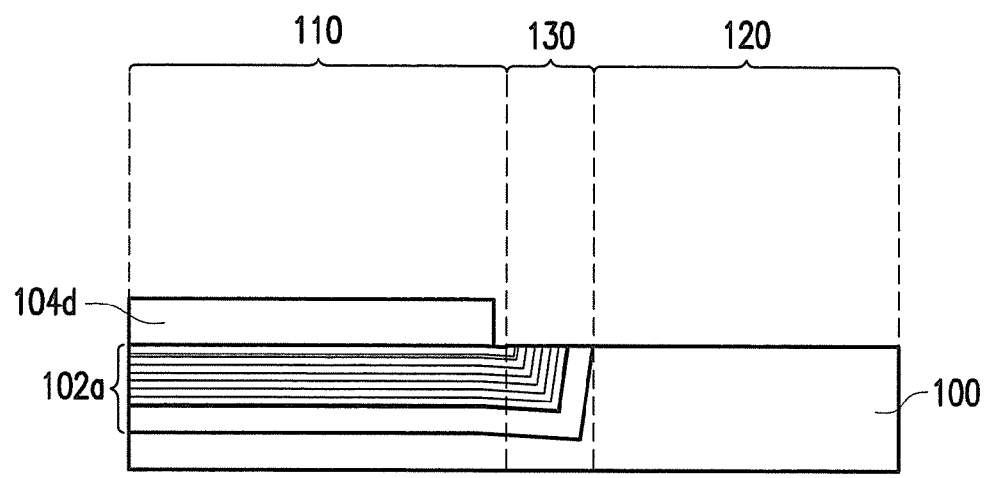

Referring to FIG. 2D, a second etching process is performed to expose the top surface of the substrate 100 in the second region 120. In an embodiment, the second etching process may be an anisotropic etching process, for example. By choosing an etchant having a low or extremely low etching rate to the flowable material layers 104a, 104b, and 104c but having a high etching rate to a stack layer 102a, the flowable material layers 104a, 104b, and 104c may be directly used as a mask to self align to the second region 120 where the flowable material layer 104a does not cover or where the flowable material layer 104b/104c is thinner and to partially remove the stack layer 102 in the third region 130 without having to use a photolithography process to define an etching region. Thus, a misalignment that occurs in the photolithography process may be prevented.

After performing the second etching process, a top surface of the stack layer 102a in the third region 130 is exposed, and the top surface of the stack layer 102a in the third region 130 is approximately equal to the top surface of the substrate 100 in the second region 120. In an embodiment, after the second etching process is performed, a partial flowable material layer 104d still remains on the substrate 100 in the first region 110. In another embodiment, after the second etching process is performed, the flowable material 104a on the substrate 100 in the first region 110 is completely removed.

Besides, referring back to FIGS. 2C and 3, an etching rate of the second etching process to the dielectric layers 101a in an embodiment is approximately equal to an etching rate thereof to the conductive layers 101b. In this way, after the second etching process, most of the top surface of the stack layer 102a in the third region 130 is a substantially smooth surface, instead of a rough surface. However, when performing the second etching process, it is also possible that a recess is formed at the stack layer 102a of the third region 130, and the recess is acceptable.

In addition, an etch recipe of the second etching process may be adjusted based on the thickness T of the flowable material layer 104 and the second step height H2. For example, after the flowable material layer 104a is formed on the stack layer 102, as shown in FIG. 2C, when the thickness T5 of the flowable material layer 104a in the first region 110 is equal to the second step height H2, or as shown in FIG. 8, when the thickness T6 of the flowable material layer 104b in the first region 110 is greater than the second step height H2, the etching rate of the second etching process to the flowable material layer 104a or 104b may be lower than or equal to the etching rate to the stack layer 102. However, as shown in FIG. 9, when the thickness T7 of the flowable material layer 104c in the first region 110 is less than the second step height H2, a minimally required ratio of etching rate between the flowable material layer 104c and the stack layer 102 in the second etching process is (T7-t2):H2. In other words, when performing the second etching process, the etching rate of the etchant to the flowable material layer 104c needs to be significantly lower than the etching rate to the stack layer 102. In this way, when performing the second etching process, a thickness of a flowable material layer 104c in the first region 110 already suffices to protect the stack layer 102 underneath from being damaged.

Figure 2E:
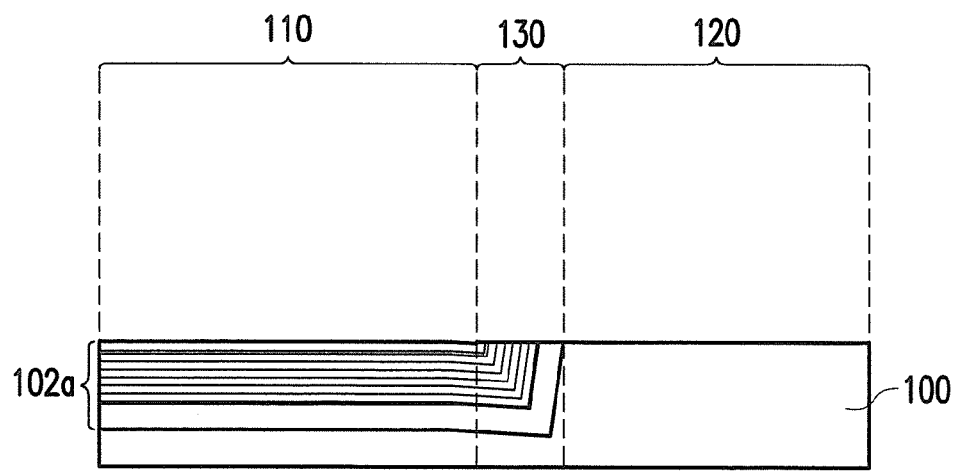

Referring to FIGS. 2D and 2E, a dry strip process or a wet strip process is performed to remove the flowable material layer 104d to expose the top surface of the stack layer 102a in the first region 110. After removing the flowable material layer 104d, the top surface of the stack layer 102a in the first region 110 and the third region 130 is substantially equal to the top surface of the substrate 100 in the second region 120. In the third region 130 originally having the second step height H2, most of the top surface of the stack layer 102a in the third region 130 is also a smooth surface, instead of a rough top surface as in the conventional technology. In this way, the method for fabricating the semiconductor device according to the embodiments of the invention simplifies the complexity of subsequent processes, thus increasing product reliability.

Figure 2F:
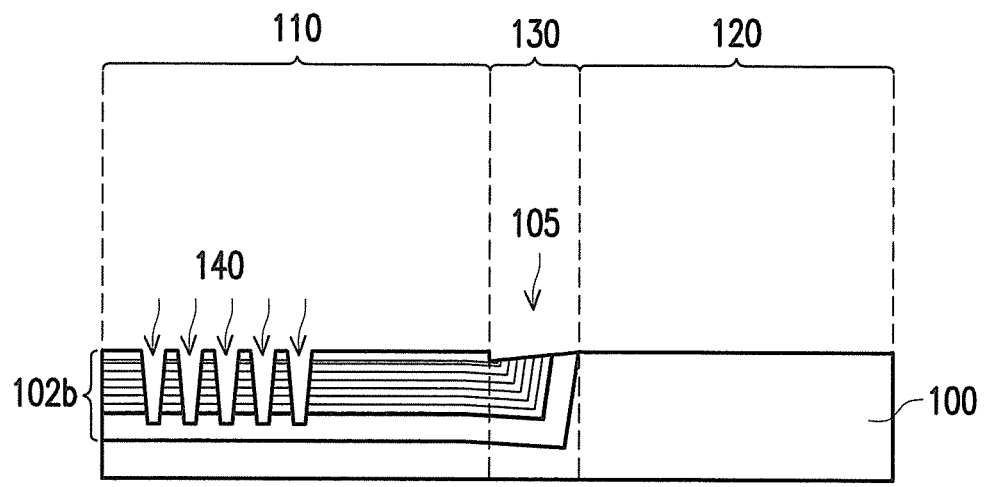

Referring to FIG. 2F, after removing the flowable material layer 104d in the first region 110, a second patterning process is performed to the stack layer 102a in the first region 110 to remove a part of the stack layer 102a in the first region 110, thereby forming a plurality of trenches/holes 140 in a stack layer 102b in the first region 110. Since the second patterning process may partially remove the stack layer 102b in the third region 130, a top surface of the stack layer 102b in the third region 130 is substantially equal to or lower than the top surface of the substrate 100 in the second region 120. However, in terms of the product reliability of a finalized product, the recess 105 of the stack layer 102b in the third region 130 is acceptable. In an embodiment, a depth of the recess 105 is less than 10 nm. In another embodiment, a depth of the recess 105 is 1 nm to 10 nm.

Figure 2G:
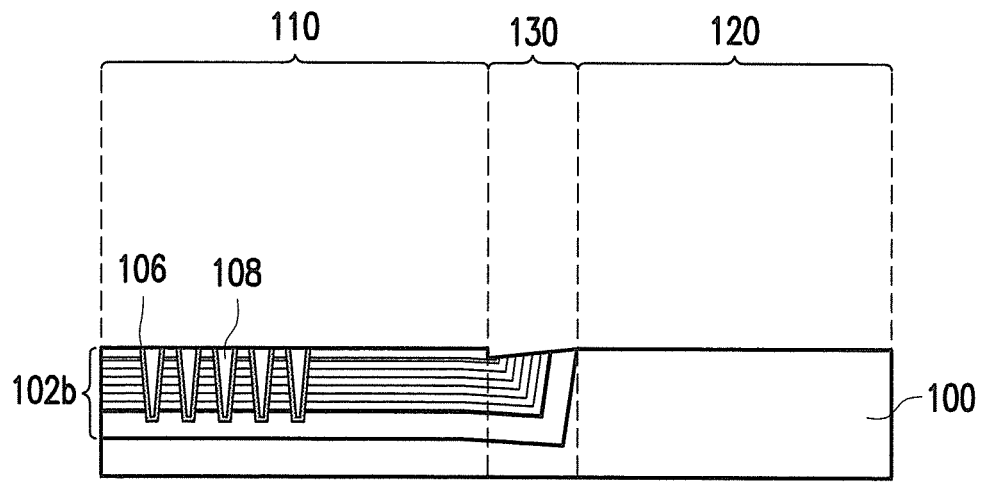

Referring to FIG. 2G, a charge storage layer 106 and corresponding conductive pillars 108 are sequentially formed in each of the trenches/holes 140. The charge storage layer 106 is disposed between the conductive pillars 108 and the stack layer 102b. Specifically, the charge storage layer 106 is conformally formed in each of the trenches 140 firstly. Then, a conductive material layer (not shown) is formed on the stack layer 102b, and the conductive material layer is filled into the trenches 140. Subsequently, a planarization process is performed to remove a part of the conductive material layer to expose the top surface of the stack layer 102b. In an embodiment, the charge storage layer 106 may be a composite layer formed of oxide-nitride-oxide (ONO), for example. The composite layer may have three or more layers, but the invention is not limited thereto. A method of forming the composite layer may be the chemical vapor deposition method, the thermal oxidation method, for example. A material of the conductive pillars 108 may be doped polysilicon, undoped polysilicon, or a combination thereof, and a method of forming the conductive pillars 108 may be the chemical vapor deposition method.

Referring to FIG. 2E again, the semiconductor device according to the embodiments of the invention includes the substrate 100 and the stack layer 102a. The substrate 100 includes the first region 110, the second region 120, and the third region 130. The third region 130 is located between the first region 110 and the second region 120. The top surface of the substrate 100 in the first region 110 is lower than the top surface of the substrate 100 in the second region 120, and the substrate 100 in the third region 130 has the first step height H1. The stack layer 102a is disposed on the substrate 100 in the first and third regions 110 and 130. The stack layer 102a includes the plurality of dielectric layers 101a and a plurality of conductive layers 101b. The dielectric layers 101a and the conductive layers 101b are stacked alternately. The top surface of the stack layer 102b in the first region 110 and the third region 130 and the top surface of the substrate 100 of the second region 120 are substantially coplanar.

In view of the foregoing, in the embodiments of the invention, the flowable material layer that covers the stack layer in the memory cell array region (e.g. the first region) and partially covers the stack layer in the boundary region (e.g. the third region) is used as a mask to etch the stack layer in the peripheral circuit region (e.g. the second region) and the boundary region (e.g. the third region). In this way, the top surface of the stack layer in the memory cell array region (e.g. the first region) and the boundary region (e.g. the third region) is approximately equal to the top surface of the substrate in the second region. Accordingly, the step height in the boundary region (e.g. the third region) between the memory cell array region (e.g. the first region) and the peripheral circuit region (e.g. the second region) is reduced, thereby simplifying the complexity of the subsequent processes.

In addition, in the embodiments of the invention, the thickness of the flowable material layer and the second step height may also be used to adjust the etch recipe, such that after the second etching process is performed, the top surface of the stack layer in the memory cell array region (e.g. the first region) and the boundary region (e.g. the third region) is equal to the top surface of the substrate in the peripheral circuit region (e.g. the second region), and the stack layer in the memory cell array region (e.g. the first region) is prevented from being damaged. Since the top surface of the stack layer in the memory cell array region (e.g. the first region) and the boundary region (e.g. the third region) and the top surface of the substrate in the peripheral circuit region (e.g. the second region) is substantially coplanar, several subsequent processes of fabrication may be omitted, and the cost of fabrication is consequently reduced by approximately 3%. Moreover, in the embodiments of the invention, the boundary region between the memory cell array region and the peripheral circuit region may also be reduced, thereby increasing the chip area and further reducing the cost of fabrication.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A semiconductor device, comprising:
   a substrate, comprising a first region, a second region, and a third region, wherein the third region is disposed between the first region and the second region, a top surface of the substrate in the first region is lower than the top surface of the substrate in the second region, and the substrate in the third region has a first step height; and
   a stack layer, disposed on the substrate in the first region and the third region, wherein a top surface of the stack layer in the first region and the third region and the top surface of the substrate in the second region are substantially coplanar, the stack layer covers an entire top surface and an entire sidewall of the substrate of the third region, and the entire sidewall of the substrate of the third region is in direct contact with the stack layer.

2. The semiconductor device as claimed in claim 1, wherein the top surface of the stack layer in the third region is substantially equal to or lower than the top surface of the substrate in the second region.

3. The semiconductor device as claimed in claim 1, wherein the stack layer comprises a plurality of dielectric layers and a plurality of conductive layers, and the dielectric layers and the conductive layers are stacked alternately.

4. The semiconductor device as claimed in claim 3, further comprising:
   a plurality of conductive pillars, disposed in the stack layer in the first region; and
   a plurality of charge storage layers, disposed between the conductive pillars and the stack layer.

5. The semiconductor device as claimed in claim 1, wherein the first region is a memory cell array region, and the second region is a peripheral circuit region.

6. The semiconductor device as claimed in claim 1, wherein a width of the third region is from 40 nm to 140 nm.

7. A semiconductor device, comprising:
   a substrate, comprising a first region, a second region, and a third region, wherein the third region is disposed between the first region and the second region, a top surface of the substrate in the first region is lower than the top surface of the substrate in the second region, and the substrate in the third region has a first step height;
   a stack layer, disposed on the substrate in the first region and the third region, wherein a top surface of the stack layer in the first region and the third region and the top surface of the substrate in the second region are substantially coplanar;
   a plurality of conductive pillars, disposed in the stack layer in the first region; and
   a plurality of charge storage layers, disposed between the conductive pillars and the stack layer, wherein the charge storage layers do not contact with the substrate.

8. The semiconductor device as claimed in claim 7, wherein the top surface of the stack layer in the third region is substantially equal to or lower than the top surface of the substrate in the second region.

9. The semiconductor device as claimed in claim 7, wherein the stack layer comprises a plurality of dielectric layers and a plurality of conductive layers, and the dielectric layers and the conductive layers are stacked alternately.

10. The semiconductor device as claimed in claim 7, wherein the first region is a memory cell array region, and the second region is a peripheral circuit region.

11. The semiconductor device as claimed in claim 7, wherein a width of the third region is from 40 nm to 140 nm.

* * * * *